(12) United States Patent
Cheng et al.

(10) Patent No.: US 9,468,128 B2
(45) Date of Patent: Oct. 11, 2016

(54) SERVER AND CASING THEREOF

(71) Applicants: INVENTEC (PUDONG) TECHNOLOGY CORPORATION, Shanghai (CN); INVENTEC CORPORATION, Taipei (TW)

(72) Inventors: Tsai-Kuei Cheng, Taipei (TW); Po-Wen Chen, Taipei (TW); Tsung-Bin Tsai, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 14/677,680

(22) Filed: Apr. 2, 2015

(65) Prior Publication Data

US 2016/0150668 A1  May 26, 2016

(30) Foreign Application Priority Data

Nov. 26, 2014 (CN) .......................... 2014 1 0692502

(51) Int. Cl.
*H05K 7/14* (2006.01)

(52) U.S. Cl.
CPC .................... *H05K 7/1489* (2013.01)

(58) Field of Classification Search
CPC ........ A47F 5/00; H05K 5/00; H05K 5/0204; H05K 5/0217; H05K 7/14; H05K 7/1411; H05K 7/1488; H05K 7/1489; H05K 7/183
USPC ......... 361/608, 609, 679.34, 679.36, 679.39, 361/724, 725, 727; 312/223.2, 334.1, 312/334.8, 334.44, 334.46, 350, 333; 211/26
See application file for complete search history.

(56) References Cited

U.S. PATENT DOCUMENTS

| | | | | |
|---|---|---|---|---|
| 5,123,721 A * | 6/1992 | Seo | ......................... | G06F 1/184 312/333 |
| 5,626,406 A * | 5/1997 | Schmid | .................. | A47B 88/08 211/26 |
| 5,992,957 A * | 11/1999 | Ecker | .................... | H05K 7/1411 312/334.16 |
| 6,299,266 B1 * | 10/2001 | Justice | .................... | G06F 1/184 292/87 |
| 7,198,338 B2 * | 4/2007 | Liu | ......................... | A47B 67/04 312/223.1 |
| 8,971,036 B1 * | 3/2015 | Lau | ........................... | G06F 1/20 361/679.34 |
| 2003/0184964 A1 * | 10/2003 | Neukam | ................. | G06F 1/184 361/679.39 |
| 2003/0193781 A1 * | 10/2003 | Mori | .................... | H05K 7/1489 361/725 |
| 2007/0035920 A1 * | 2/2007 | Peng | ..................... | G11B 33/124 361/679.31 |
| 2010/0089853 A1 * | 4/2010 | Wang | .................... | A47B 88/12 211/183 |
| 2011/0128695 A1 * | 6/2011 | Fang | ....................... | G06F 1/187 361/679.34 |
| 2012/0257845 A1 * | 10/2012 | Fan | ...................... | H05K 7/1489 384/35 |
| 2013/0278124 A1 * | 10/2013 | Hu | ....................... | A47B 96/025 312/333 |

* cited by examiner

*Primary Examiner* — James O Hansen

(74) *Attorney, Agent, or Firm* — Huffman Law Group, PC

(57) ABSTRACT

A casing includes a shell, at least one carrier tray, at least one slide rail assembly and a buffering component. The shell has an accommodating space and an opening corresponding to the accommodating space. The carrier tray is located in the accommodating space. The slide rail assembly includes an outer rail fixed to the shell, a middle rail, and an inner rail. The carrier tray is fixed to the inner rail, such that the carrier tray is slidably assembled with the shell through the slide rail assembly, thereby being extracted outward from the opening or entering the accommodating space through the opening. The buffering component is assembled with the shell, penetrates through the shell and the outer rail, and is pressed against the middle rail. When the middle rail slides relative to the outer rail, the slide rail assembly is buffered by the buffering component.

6 Claims, 12 Drawing Sheets

SERVER AND CASING THEREOF

CROSS-REFERENCE TO RELATED APPLICATIONS

This non-provisional application claims priority under 35 U.S.C. §119(a) on Patent Application No(s). 201410692502.5 filed in China on Nov. 26, 2014, the entire contents of which are hereby incorporated by reference.

BACKGROUND

1. Technical Field

The disclosure relates to a server. More particularly, the disclosure relates to a server with a carrier tray.

2. Background

With the development of technology, the internet is widely used in daily life for getting access to information form other individuals and organizations. Accordingly, the requirement of the hardware (such as a server) has increased, so a user can save more infomation or data in the server.

Generally, a host of the server is disposed in a rack through a carrier tray. The carrier tray can be extracted outward from the rack or inserted into the rack, such that the user can take the host out of the rack or put the host into the rack. However, in order to enhance the function or capability of the host, more hardware modules, such as a hard disk drive, a power supply and a processing unit are disposed on the host, therefore, making the server heavier. When the host comprises many hard disk drives, the user cannot steadily hold the host and the carrier tray since the user cannot bear the total weight of the host and the carrier tray. Thus, the rack is easily impacted by the carrier tray, thereby generating shocks when the user takes the host out of the rack or puts the host into the rack. The shocks may cause electronic components in the rack to break down. Thus, it is important to prevent damaging the electronic components due to the shocks when the user removes the host out of the rack or puts the host into the rack.

SUMMARY

One aspect of the disclosure provides a casing which comprises a shell, at least one carrier tray, at least one slide rail assembly and a buffering component. The shell has an accommodating space and an opening corresponding to the accommodating space. The at least one carrier tray is located in the accommodating space. The at least one slide rail assembly comprises an outer rail, a middle rail and an inner rail. The outer rail is fixed to the shell. The at least one carrier tray is fixed to the inner rail, such that the at least one carrier tray is slidably assembled with the shell through the slide rail assembly, thereby being able to be extracted outward from the opening or inserted into the accommodating space through the opening. The buffering component is assembled with the shell, penetrates through the shell and the outer rail, and is pressed against the middle rail. When the middle rail slides relative to the outer rail, the slide rail assembly is buffered by the buffering component.

Another aspect of the disclosure provides a server which comprises a shell, at least one carrier tray, an electronic component, at least one slide rail assembly and a buffering component. The shell has an accommodating space and an opening corresponding to the accommodating space. The at least one carrier tray is located in the accommodating space. The electronic component is disposed on the at least one carrier tray. The at least one slide rail assembly comprises an outer rail, a middle rail and an inner rail. The outer rail is fixed to the shell. The middle rail is slidably assembled with the outer rail. The inner rail is slidably assembled with the middle rail. The at least one carrier tray is fixed to the inner rail, such that the at least one carrier tray is slidably assembled with the shell through the slide rail assembly, thereby being extracted outward from the opening or entering the accommodating space through the opening. The buffering component is assembled with the shell, penetrates through the shell and the outer rail, and is pressed against the middle rail. When the middle rail slides relative to the outer rail, the slide rail assembly is buffered by the buffering component.

BRIEF DESCRIPTION OF THE DRAWINGS

The disclosure will become more fully understood from the detailed description given herein-below and the accompanying drawings which are given by way of illustration only and thus are not limitative of the disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
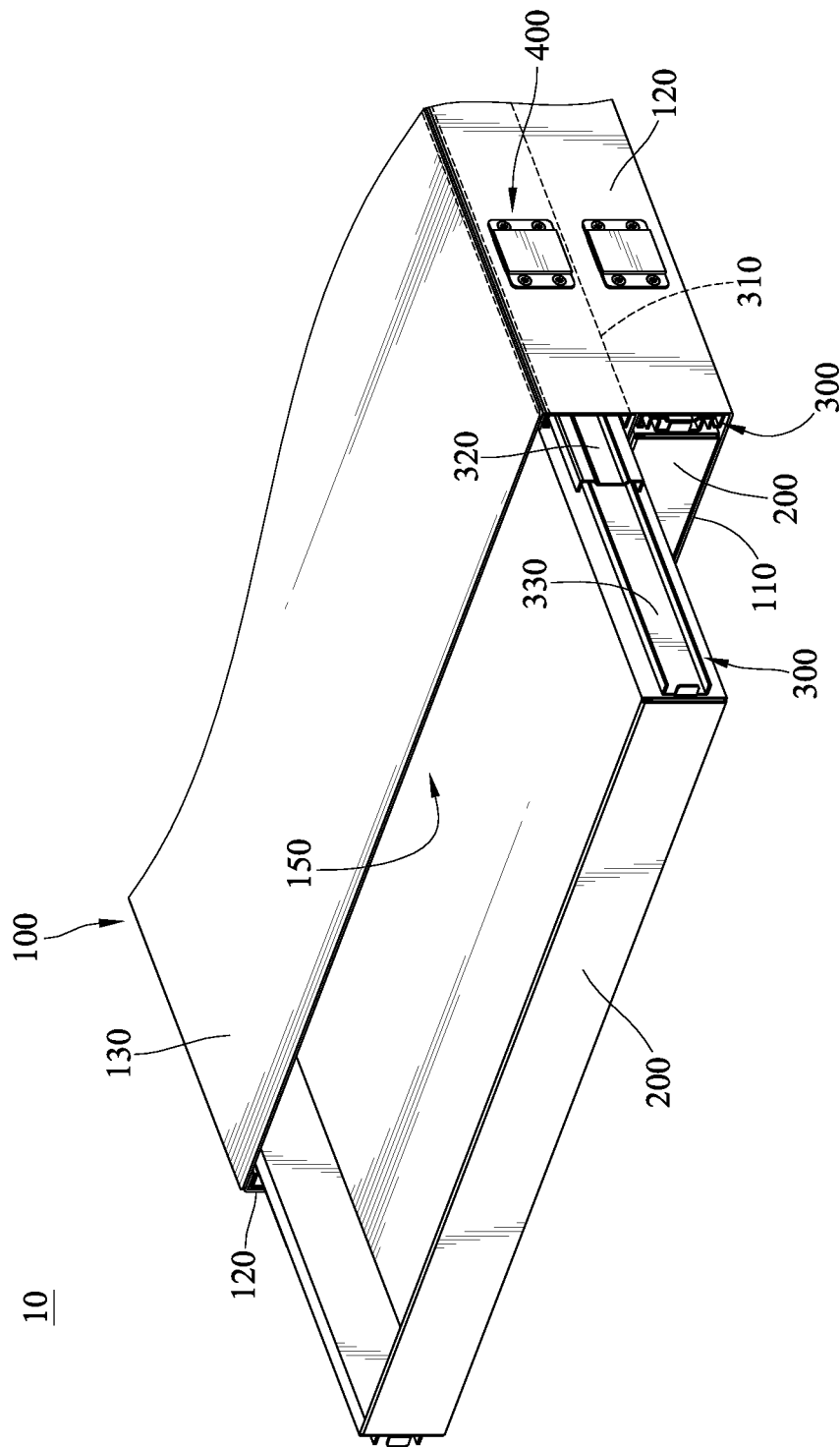
FIG. 1 is a partially perspective view of a casing according to a first embodiment of the disclosure.
Figure 2:
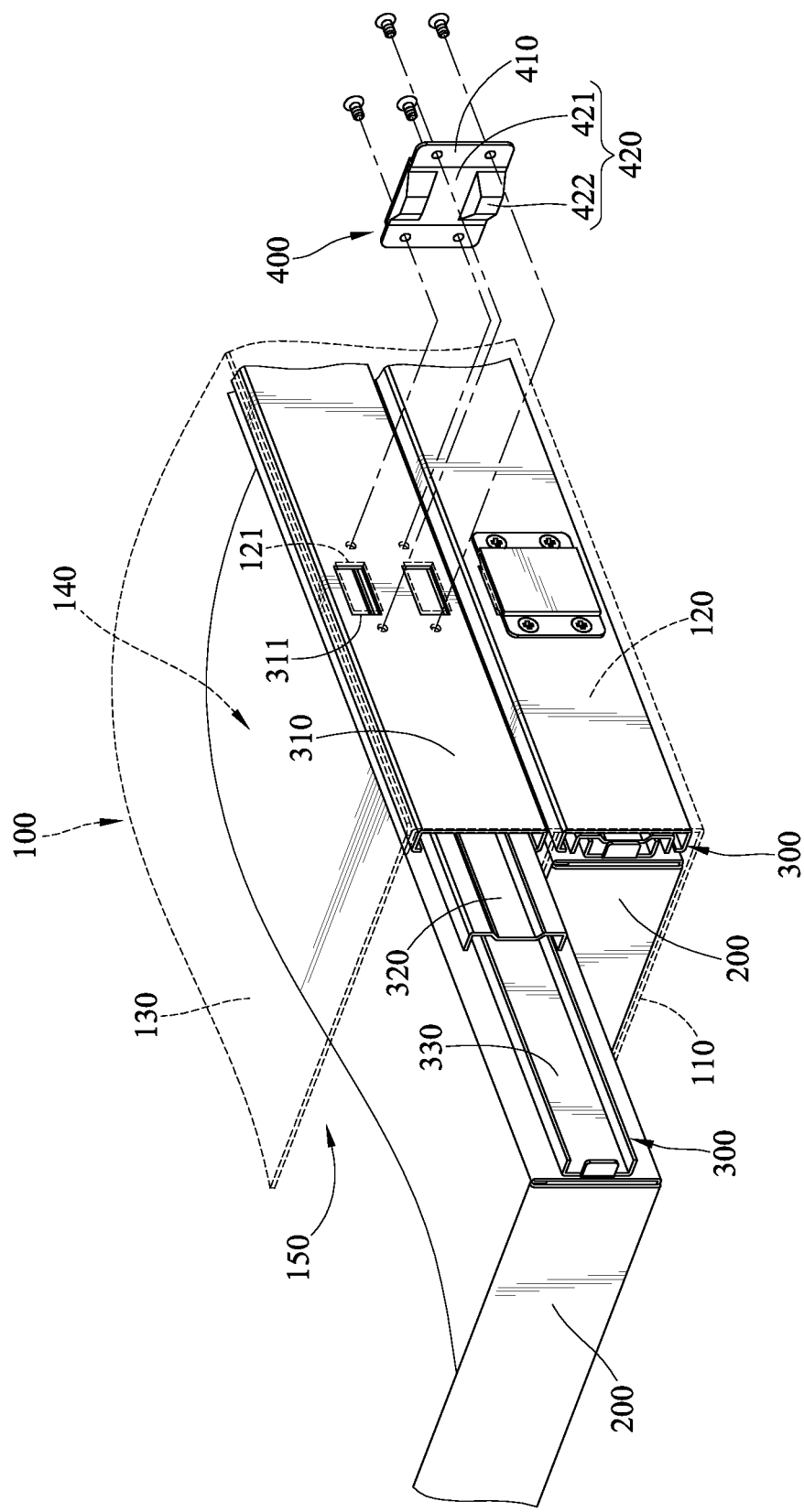
FIG. 2 is a partially exploded view of the casing in FIG. 1.
Figure 3:
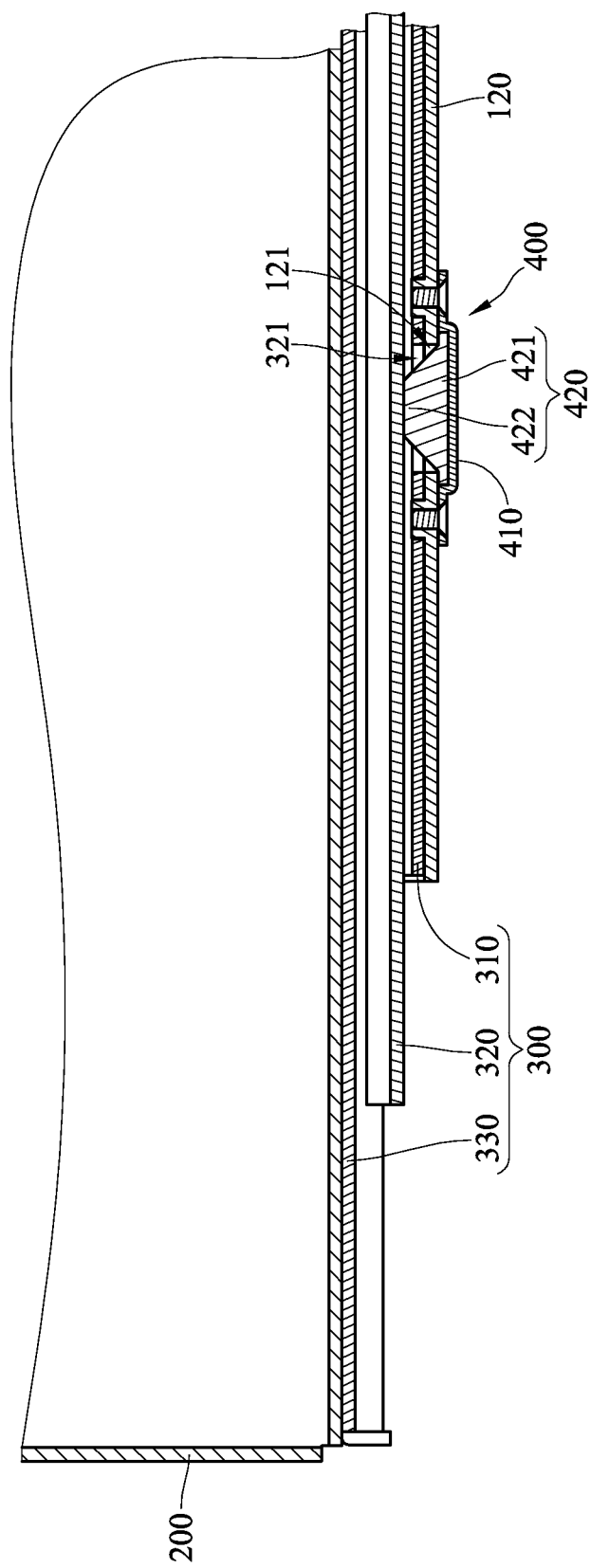
FIG. 3 is a cross-sectional view of the casing in FIG. 1.

Please refer to FIG. 1 through FIG. 3. FIG. 1 is a partially perspective view of a casing according to a first embodiment of the disclosure. FIG. 2 is a partially exploded view of the casing in FIG. 1. FIG. 3 is a cross-sectional view of the casing in FIG. 1. In this embodiment, the casing 10 comprises a shell 100, two carrier trays 200, a plurality of slide rail assemblies 300 and a plurality of buffering components 400.

The shell 100, such as a shell of a 2 U server (U is a unit of measurement which describes the height of an electronic device and a U defined by Electronic Industries Alliance is 1.75 inches). The casing 10 comprises a bottom plate 110 with two sides opposite to each other, two side plates 120 and a top plate 130 with two sides opposite to each other. The two side plates 120 are connected to the two sides of the bottom plate 110, respectively. The two sides of the top plate 130 are connected to the two side plates 120, respectively. Accordingly, an accommodating space 140 and an opening 150 (corresponding to the accommodating space 140) are formed and surrounded by the bottom plate 110, the two side plates 120 and the top plate 130.

One of the two carrier trays 200 is stacked on the other carrier tray 200 (i.e., two stories, one on top and the other on the bottom) and both of them are located inside the accommodating space 140. Each slide rail assembly 300 comprises an outer rail 310, a middle rail 320 and an inner rail 330. The middle rail 320 is slidably assembled with the outer rail 310. The inner rail 330 is slidably assembled with the middle rail 320. Each carrier tray 200 with two sides opposite to each other is corresponding to the two slide rail assemblies 300. The two slide rail assemblies 300 are corresponding to the two sides of the carrier tray 200, respectively. The outer rails 310 are fixed to the two side plates 120 respectively. The inner rails 330 are fixed to the two sides of each carrier tray 200, respectively. Thus, the two carrier trays 200 are slidably assembled with the shell 100 through the slide rail assemblies 300, such that the two carrier trays 200 can either be extracted outward from the opening 150 or enter the accommodating space 140 through the opening 150. Moreover, each outer rail 310 has a plurality of through holes 311, and each side plate 120 has a plurality of open slot 121.

The buffering component 400 comprises a fixed plate 410 and an elastic cushion 420. The fixed plate 410, for example, is an iron plate. The elastic cushion 420, such as a rubber pad, comprises a base part 421 and two protrusion parts 422. The two protrusion parts 422 protrude toward the slide rail assemblies 300 from the base part 421. The base part 421 is adhered to the fixed plate 410. The fixed plate 410, for example, is affixed to the side plate 120 of the shell 100 by screws. The protrusion parts 422 penetrate through the open slots 121 and the through holes 311 and are pressed against the middle rail 320.

Figure 4A:
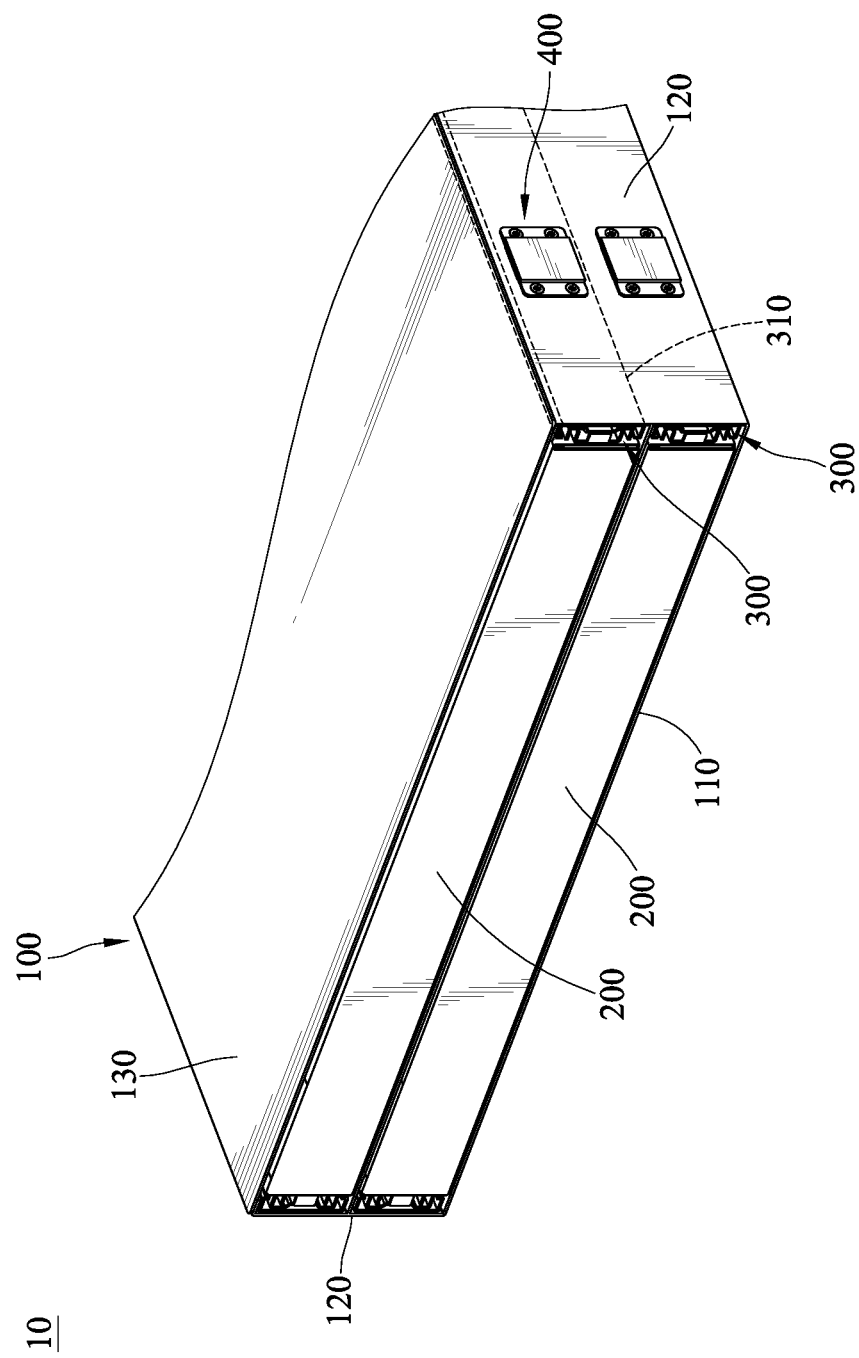
FIG. 4A through FIG. 7B are views of the casing in use in FIG. 1.
Figure 4B:
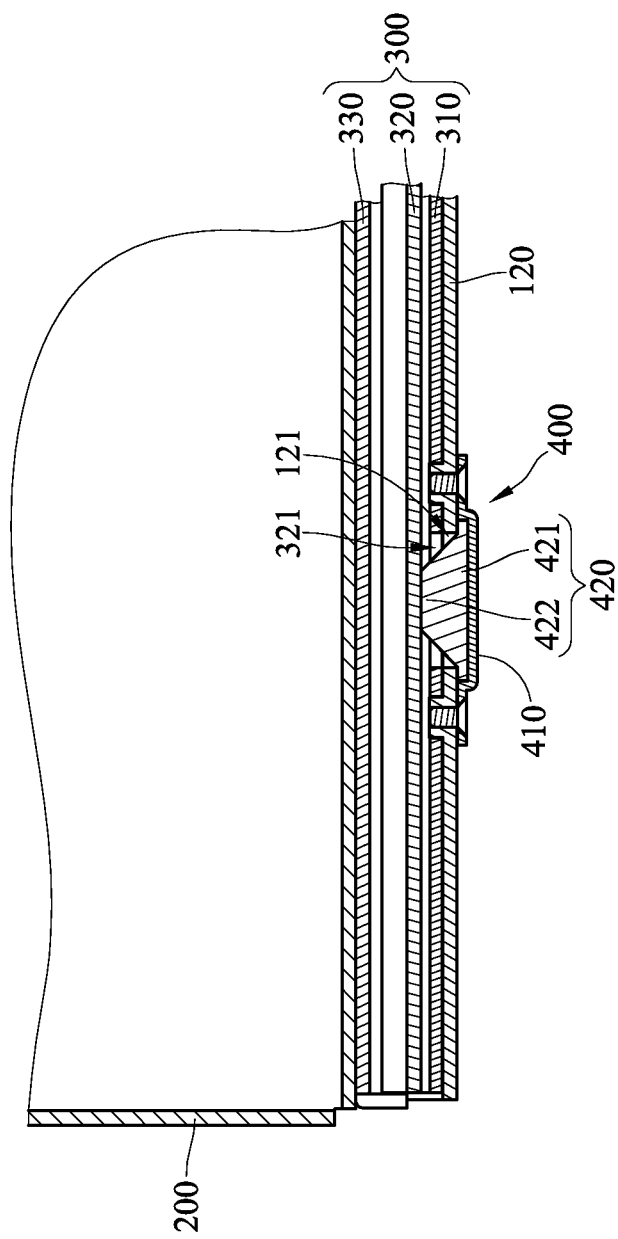

Please refer to FIG. 4A through FIG. 7B, which are usage views of the casing in FIG. 1. As shown in FIG. 4A and FIG. 4B, the accommodating space 140 accommodates the carrier trays 200, and each buffering component 400 is pressed against the middle rail 320 of the slide rail assembly 300.

Figure 5A:
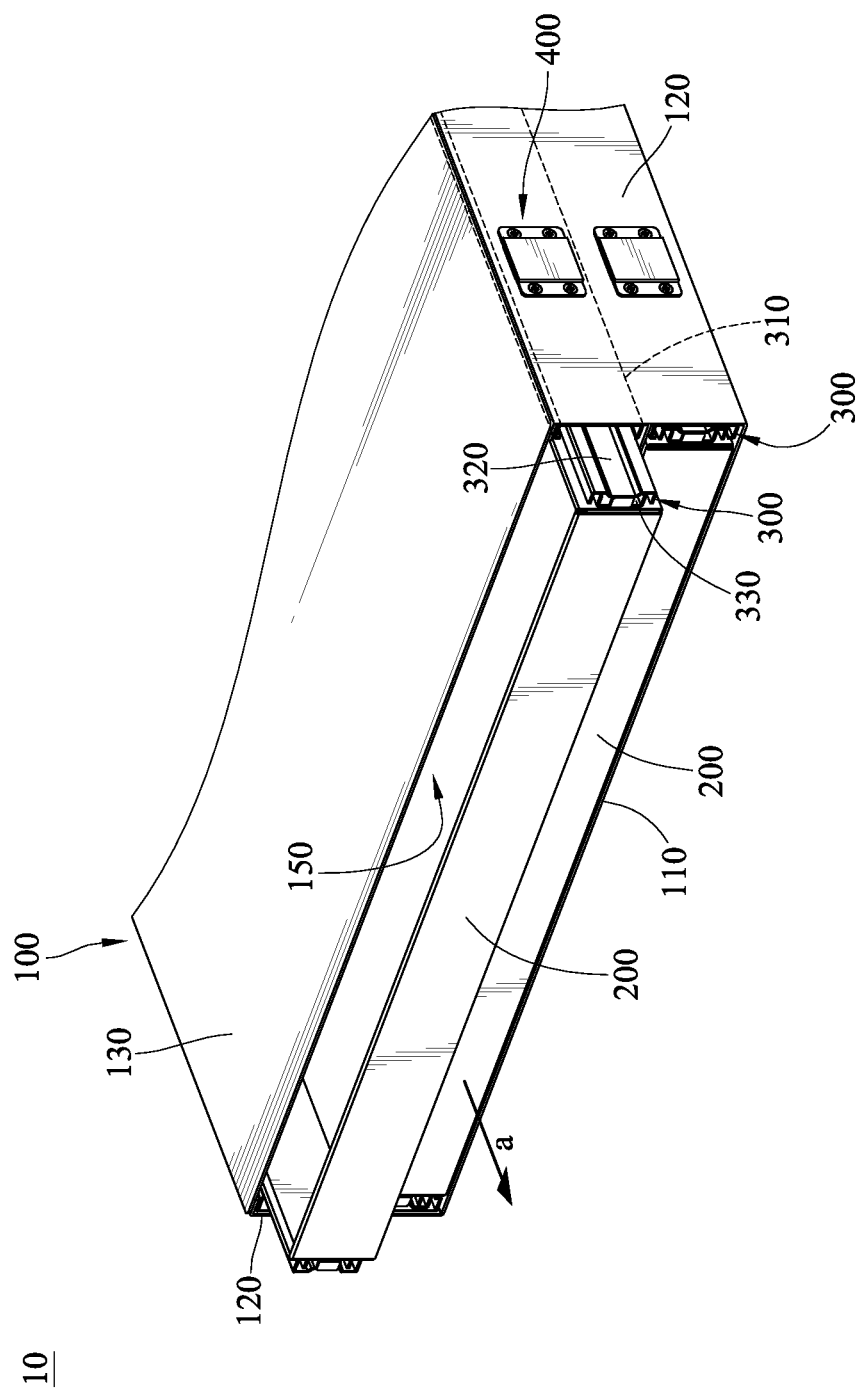
Figure 5B:
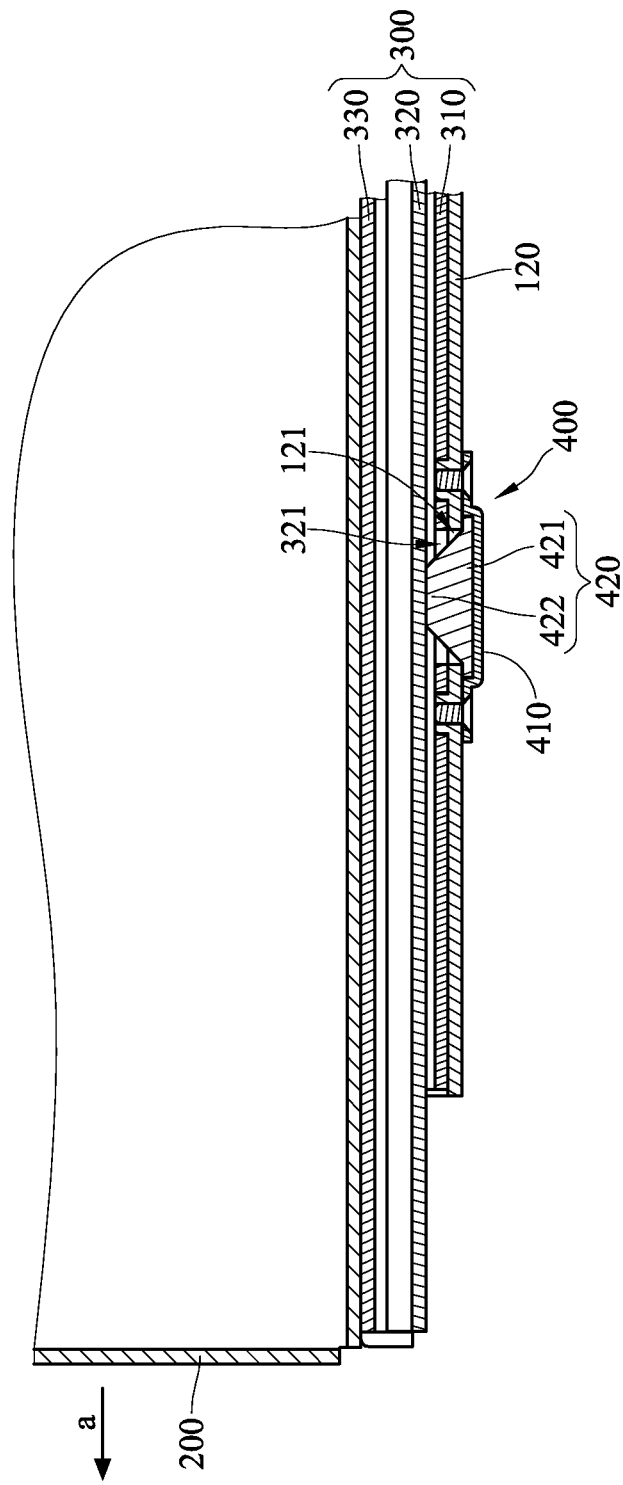

As shown in FIG. 5A and FIG. 5B, a user extracts the carrier tray 200 outward from the opening 150 along a direction indicated by an arrow a. The carrier tray 200 is static at the beginning, such that the user needs to extract the carrier tray 200 with greater effort and generates an undesired shock. When an electronic component (not shown in FIGS.) is disposed on the carrier tray 200, the electronic component may break down due to the shock. However, in this embodiment, when the user extracts the carrier tray 200 outward, the inner rail 330 is pulled out simultaneously, and the middle rail 320 is driven to slide by the inner rail 330 relative to the outer rail 310 accordingly. The velocity of the carrier tray 200 is decreased since the middle rail 320 is pressed against the elastic cushion 420, and the carrier tray 200 is buffered by the elastic cushion 420. Accordingly, the shock which affect the sliding of the carrier tray 200 can be reduced when the carrier tray 200 is initiated to be extracted out.

Figure 6A:
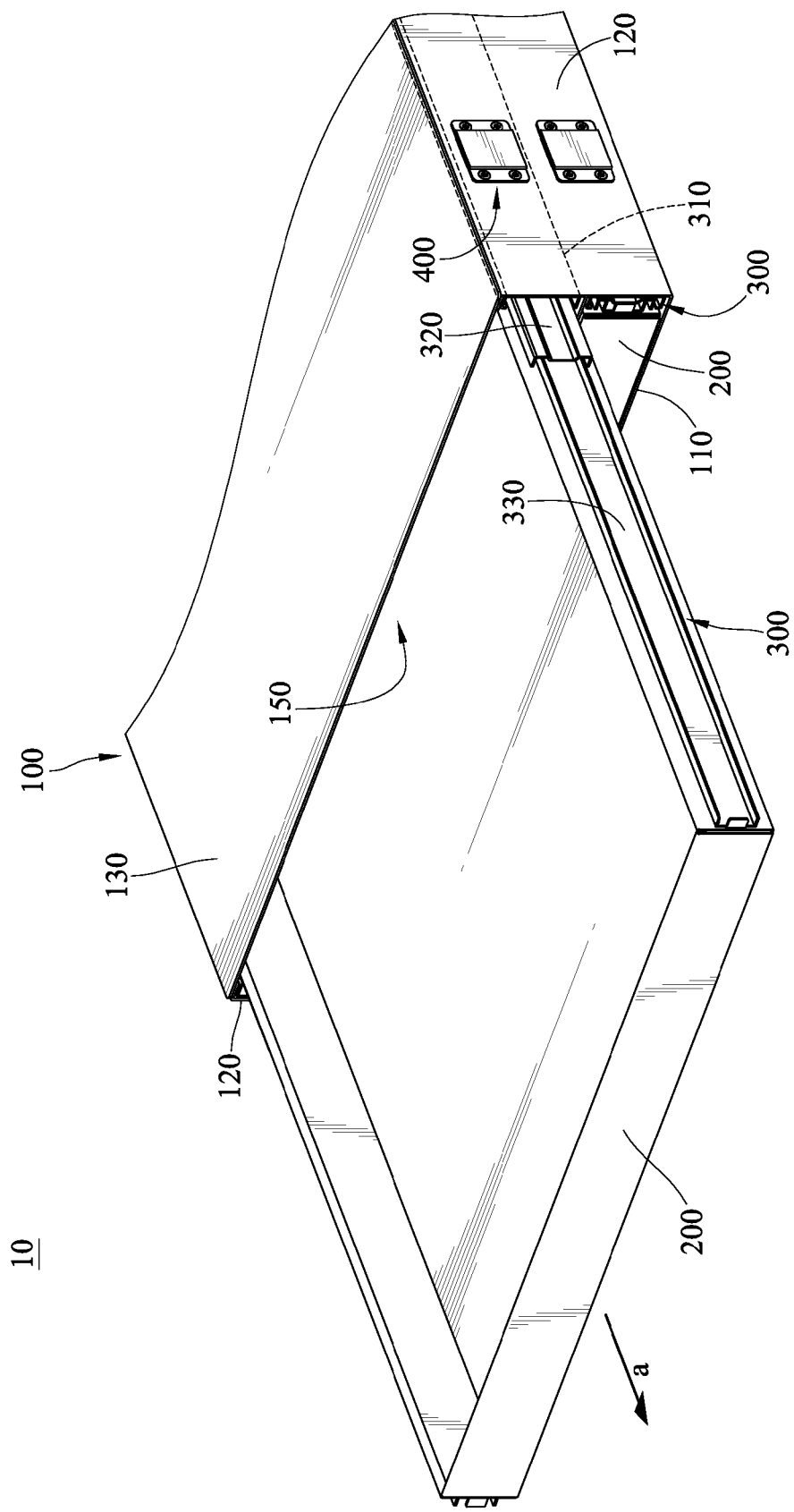
Figure 6B:
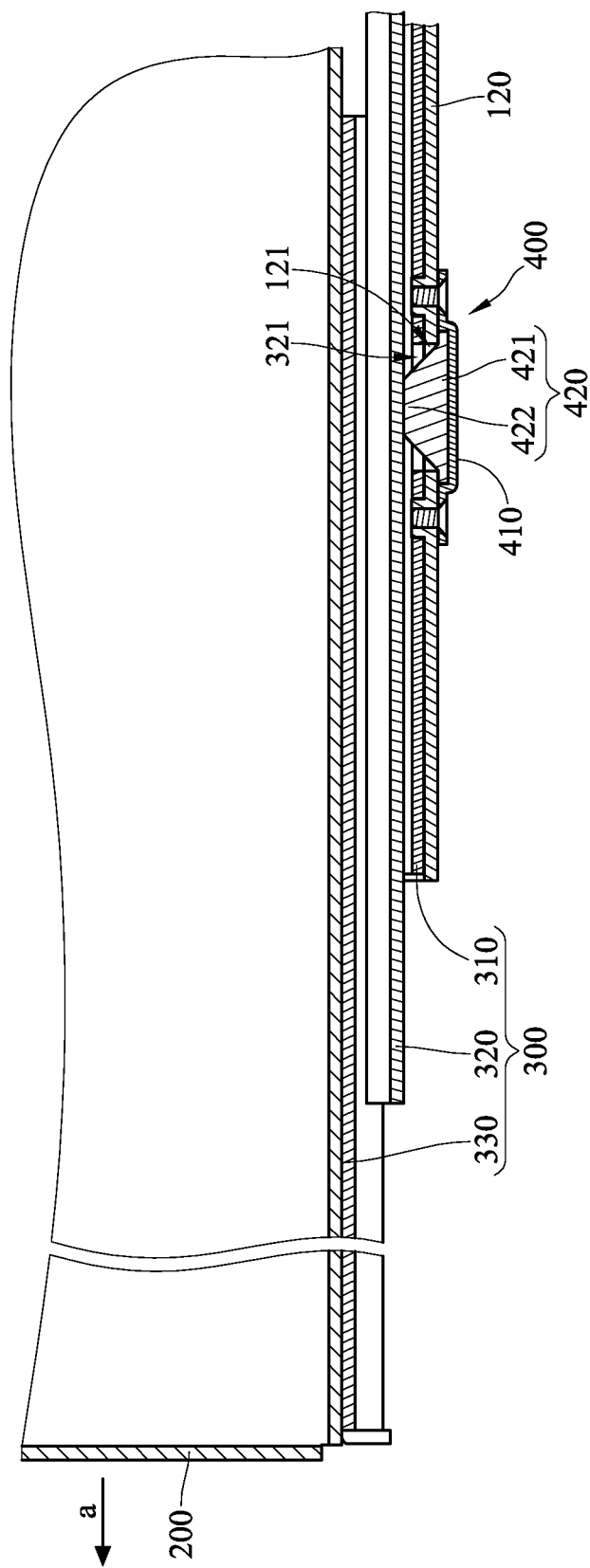

As shown in FIG. 6A and FIG. 6B, the user continuously extracts the carrier tray 200 outward along the direction indicated by the arrow a. At this time, the demand of anti-vibration effect is decreased (because the shock is easily generated when the carrier tray is extracted out initially). The slide rail assembly 300 is structured to allow the inner rail 330 to slide outward relative to the outer rail 310 alone without the middle rail 320. At the same time, since the carrier tray 200 is not buffered by the buffering component 400, the carrier tray 200 can slide smoothly relative to the shell 100.

Figure 7A:
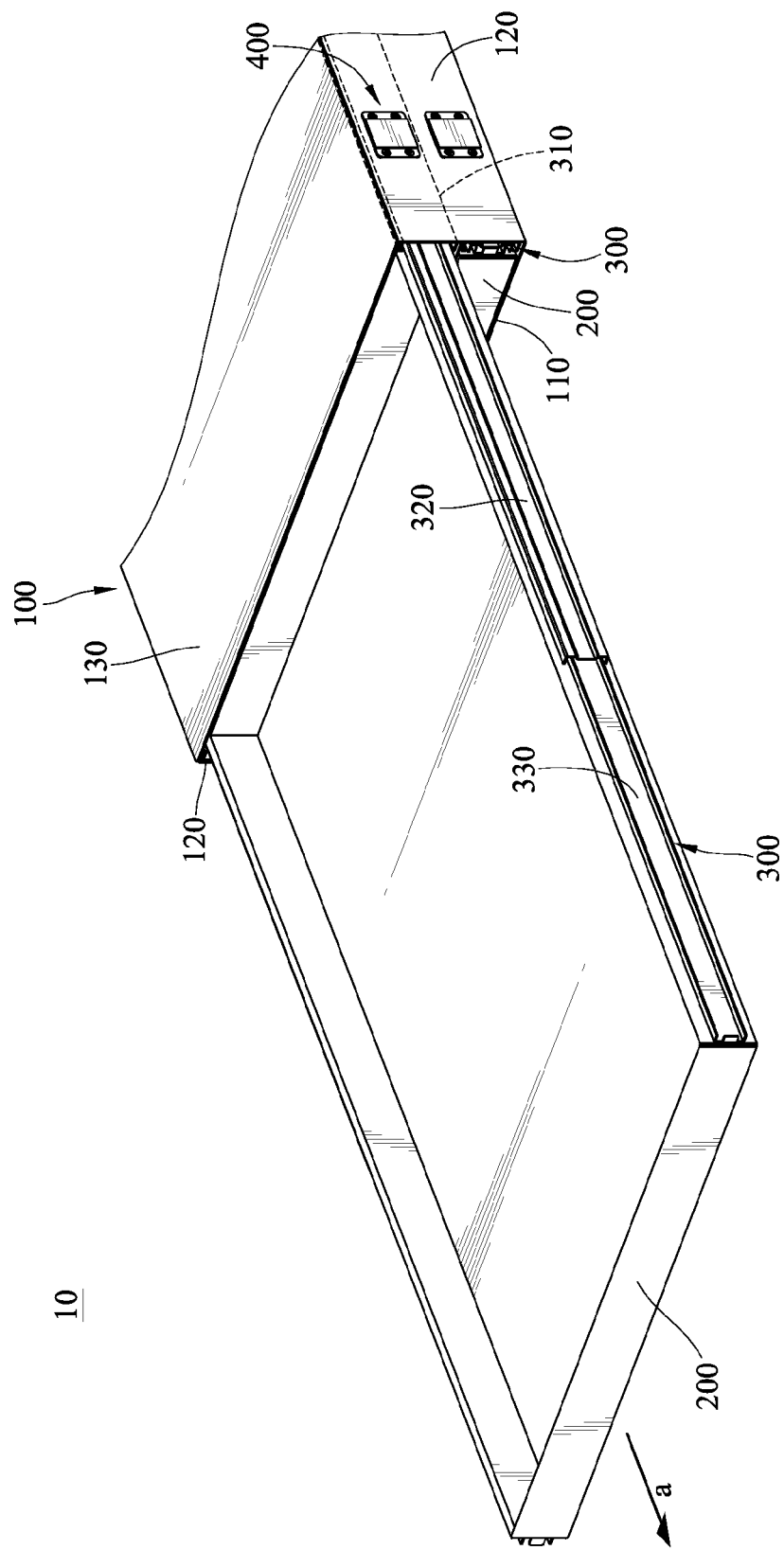
Figure 7B:
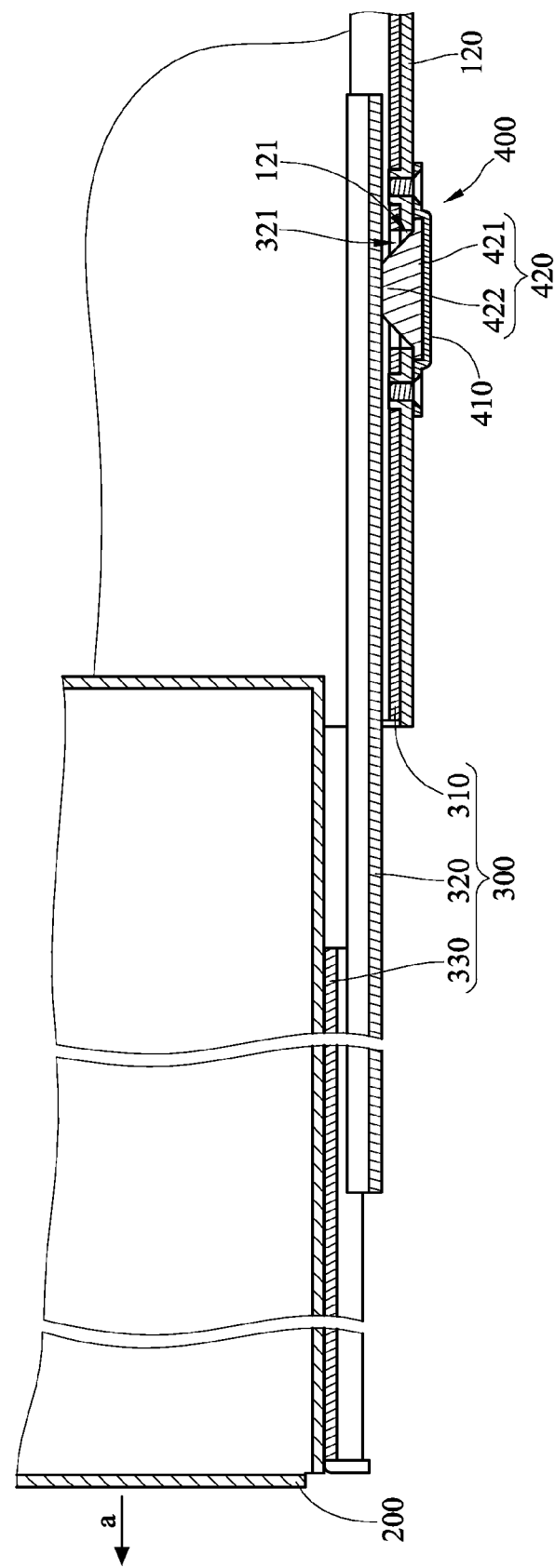

As shown in FIG. 7A and FIG. 7B, the user continuously extracts the carrier tray 200 outward along the direction indicated by the arrow a. At this moment, since the carrier tray 20 is almost extracted out from the opening 150 (or, from the accommodating space 140), the requirement of anti-vibration effect is increased. At the same time, the inner rail 330 and the middle rail 320 driven by the inner rail 330 slide relative to the outer rail 310 again, the velocity of the carrier tray 200 is decreased since the middle rail 320 is pressed against the elastic cushion 420, and the carrier tray 200 is buffered by the elastic cushion 420 again. Accordingly, the shock generated by the carrier tray 200 at this moment is also minimized.

To be noticed, the method about how each rail of the slide rail assembly 300 slides is well known in the art, such that it will not be mentioned. Only how to make the carrier tray 200 slide smoothly at the beginning and finally by the buffering component 400 is described in this disclosure.

Figure 8:
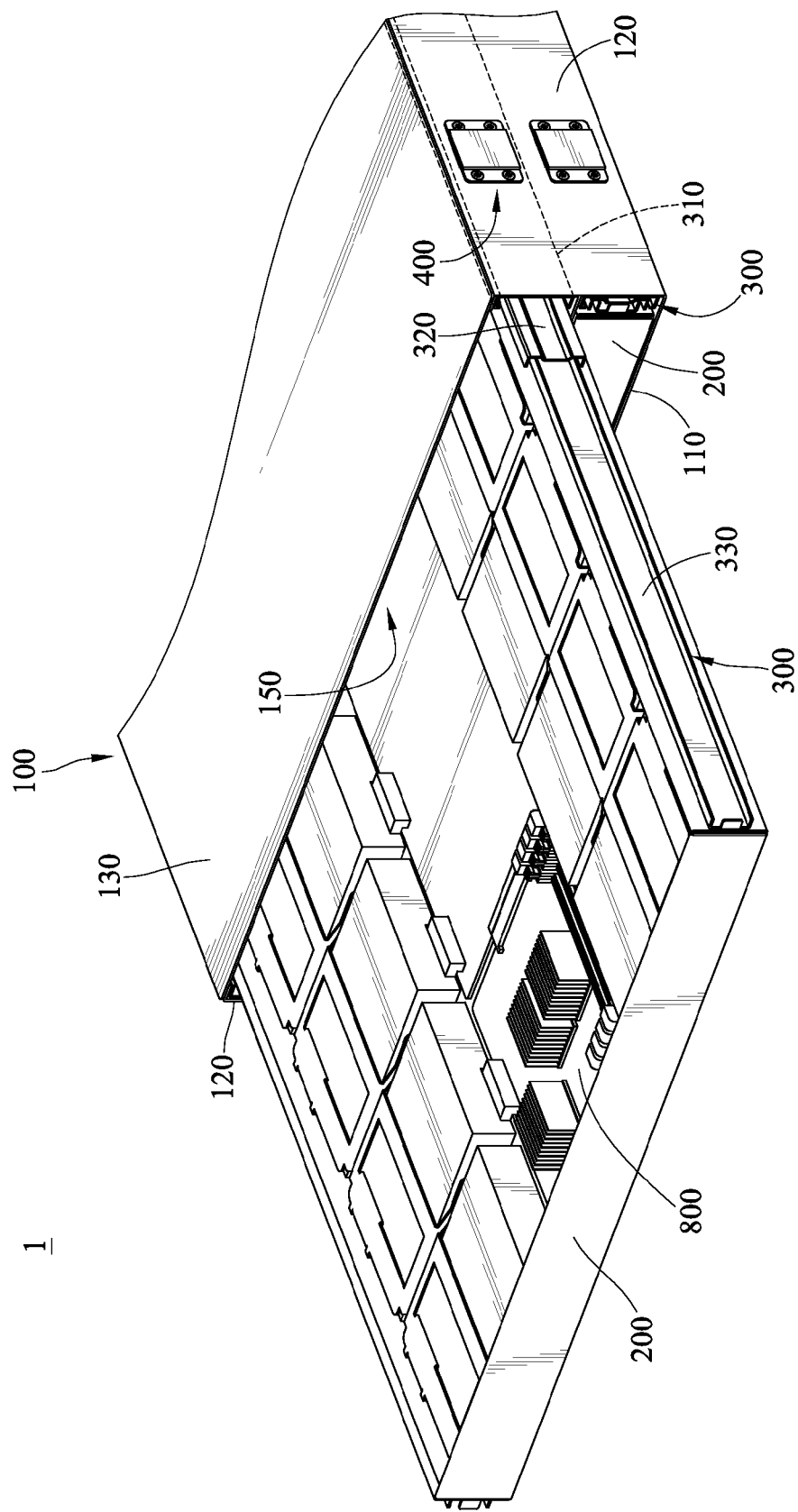
FIG. 8 is a partially perspective view of a server according to a second embodiment of the disclosure.

Please refer to FIG. 8 which is a partially perspective view of a server according to a second embodiment of the disclosure. The casing 10 in FIG. 1 can be applied for the server 1. In this embodiment, the server 1 comprises a shell 100, at least one carrier tray 200, at least one electronic component 500, at least one slide rail assembly 300 and a buffering component 400. The shell 100 has an accommodating space 140 and an opening 150 corresponding to the accommodating space 140. The carrier tray 200 is located in the accommodating space 140. The electronic component 500, for example, is a hard disk drive or a motherboard. The electronic component 500 is disposed on the carrier tray 200. The slide rail assembly 300 comprises an outer rail 310, a middle rail 320 and an inner rail 330. The outer rail 310 is fixed to the shell 100. The middle rail 320 is slidably assembled with the outer rail 310. The inner rail 330 is slidably assembled with the middle rail 320. The carrier tray 200 is fixed to the inner rail 330, such that the carrier tray 200 is slidably assembled with the shell 100 through the slide rail assembly 300. Thus, the carrier tray 200 is for being extracted outward from the opening 150 or entering the accommodating space 140 through the opening 150. The buffering component 400 is assembled with the shell 100, penetrates through the shell 100 and the outer rail 310, and is pressed against the middle rail 320. When the middle rail 320 slides relative to the outer rail 310, the slide rail assembly 300 is buffered by the buffering component 400.

According to the server and the casing of the disclosure, the buffering component penetrates through the shell and the outer rail and is pressed against the middle rail. When the middle rail slides relative to the outer rail, the slide rail assembly and the carrier tray are buffered by the buffering component which is pressed against the middle rail.

Furthermore, the middle rail of the slide rail assembly only slides relative to the outer rail and is buffered by the buffering component at the beginning and final stage, such that the carrier tray can slide smoothly without being buffered by the buffering component during slide.

The disclosure will become more fully understood from the said embodiment for illustration only and thus does not limit the disclosure. Any modifications within the spirit and category of the disclosure fall in the scope of the disclosure.

What is claimed is:
1. A casing, comprising:
a shell having an accommodating space and an opening corresponding to the accommodating space, and the shell having at least one open slot;
at least one carrier tray located in the accommodating space;
at least one slide rail assembly comprising an outer rail, a middle rail and an inner rail, the outer rail being fixed to the shell, the outer rail having at least one through hole, the at least one carrier tray being fixed to the inner rail, such that the at least one carrier tray is slidably assembled with the shell through the slide rail assem- bly, thereby being extracted outward from the opening or entering the accommodating space through the opening; and a buffering component comprising a fixed plate and an elastic cushion, the elastic cushion disposed on the fixed plate, and the fixed plate fixed to the shell;

wherein the elastic cushion penetrates through the at least one open slot and the at least one through hole and is pressed against the middle rail, and when the middle rail slides relative to the outer rail, the slide rail assembly is buffered by the buffering component.

2. The casing according to claim 1, further comprising a bottom plate with two sides opposite to each other and two side plates connected to the two sides of the bottom plate, the quantity of the at least one slide rail assembly being two, the two outer rails being fixed to the two side plates respectively, and the two inner rails being fixed to two sides of the at least one carrier tray respectively.

3. The casing according to claim 1, wherein the elastic cushion comprises a base part and two protrusion parts, the base part is interposed between the fixed plate and the shell, and the two protrusion parts protrude toward the slide rail assembly from the base part and penetrate through the at least one open slot and the at least one through hole, and are pressed against the middle rail.

4. A server, comprising:
a shell having an accommodating space and an opening corresponding to the accommodating space, and the shell having at least one open slot;
at least one carrier tray located in the accommodating space;
an electronic component disposed on the at least one carrier tray;
at least one slide rail assembly comprising an outer rail, a middle rail and an inner rail, the outer rail being fixed to the shell, the outer rail having at least one through hole, the middle rail being slidably assembled with the outer rail, the inner rail being slidably assembled with the middle rail, the at least one carrier tray being fixed to the inner rail, such that the at least one carrier tray is slidably assembled with the shell through the slide rail assembly, thereby being extracted outward from the opening or entering the accommodating space through the opening; and
a buffering component comprising a fixed plate and an elastic cushion, the elastic cushion disposed on the fixed plate, and the fixed plate fixed to the shell;
wherein the elastic cushion penetrates the at least one open slot and the at least one through hole and is pressed against the middle rail, and when the middle rail slides relative to the outer rail, the slide rail assembly is buffered by the buffering component.

5. The server according to claim 4, further comprising a bottom plate with two sides opposite to each other and two side plates connected to the two sides of the bottom plate, the quantity of the at least one slide rail assembly being two, the two outer rails being fixed to the two side plates respectively, and the two inner rails being fixed to two sides of the at least one carrier tray respectively.

6. The server according to claim 4, wherein the elastic cushion comprises a base part and two protrusion parts, the base part is interposed between the fixed plate and the shell, and the two protrusion parts protrude toward the slide rail assembly from the base part, penetrate the at least one open slot and the at least one through hole and are pressed against the middle rail.

* * * * *